United States Patent

Bailey

[15] 3,648,108

[45] Mar. 7, 1972

[54] MOLDED SHUNTS FOR INTEGRATED CIRCUITS

[72] Inventor: Richard J. Bailey, Tonawanda, N.Y.

[73] Assignee: GTI Corporation

[22] Filed: Jan. 27, 1971

[21] Appl. No.: 110,143

[52] U.S. Cl. ........................317/2 R, 174/DIG. 3, 206/46 H, 206/65 F, 339/19, 339/39

[51] Int. Cl. .............................................................H05f 3/00

[58] Field of Search..............174/DIG. 3, 52 R; 317/101 DH, 317/101 CP, 2 R, 9 R; 206/46 H, 65 F; 324/158 F; 339/19, 36

[56] References Cited

UNITED STATES PATENTS 3,172,716 3/1965 Green ....................................339/19

3,182,277 4/1965 Ashby ..................................317/9 R

*Primary Examiner*—Darrell L. Clay
*Attorney*—Buell, Blenko & Ziesenheim

[57] ABSTRACT

A carrier and conductive shunt structure for preventing static discharge from external sources which would cause damage to the integrated circuit package in the form of a nonconductive carrier having a well adapted to receive an integrated circuit with grooves in the sidewall of the well corresponding to the leads of the integrated circuit and a flange surrounding the well opening, a shunt of conductive plastic having a base generally in the shape of the integrated circuit with upstanding sidewalls having ridges corresponding to the grooves of the well of the carrier and resiliently fitting therein and bearing on the leads of the integrated circuit and channel means on the top of the shunt sidewalls engaging the flange of the carrier in locking arrangement.

5 Claims, 3 Drawing Figures

INVENTOR
Richard J. Bailey
By
Buell, Blenko & Ziesenheim
his attorneys

MOLDED SHUNTS FOR INTEGRATED CIRCUITS

This invention relates to molded shunts for integrated circuits and particularly to a molded shunt for an integrated circuit to prevent buildup of static within the circuit while handling.

It is known that integrated circuits made of metal oxide substrates are particularly sensitive to static discharge in handling. In order to avoid this various techniques have been proposed such as pushing the leads into a common layer of conductive foam, transporting them in aluminum carriers or magazines and similar devices. None of these has proven entirely satisfactory for a variety of reasons.

I have invented a novel shunt arrangement for use in conventional integrated circuit carriers which eliminates the problem of static discharge, which is inexpensive and which locks the shunt and circuit in electrical contact so that it cannot be displaced.

In a preferred embodiment I provide a nonconductive carrier having a well for receiving the integrated circuit and having a plurality of grooves extending in the sidewall of the well equal to the number of leads on the integrated circuit, a flange around the opening of the well, a shunt formed of conductive plastic having a base generally in the shape of the integrated circuit and upstanding sidewalls having ridges corresponding to the grooves in the wells of the carrier and adapted resiliently to fit therein and bear on the leads and a channel along top of the sidewall engaging the flange of the carrier. Preferably the flange is provided with a slight undercut engaging the channel to lock the shunt in place on the carrier and to completely cover the leads. The shunt is preferably formed of conductive polyethylene or equivalent plastic. Preferably the carrier is nonconductive so that the integrated circuit may be tested within the carrier with only the shunt removed.

In the foregoing general description I have set out certain objects, purposes and advantages of my invention. Other objects, purposes and advantages of this invention will be apparent from a consideration of the following description and the accompanying drawings in which.

Figure 1:
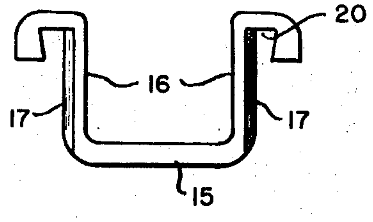
FIG. 1 is an end elevation of a shunt according to my invention for use with a Barnes carrier.
Figure 2:
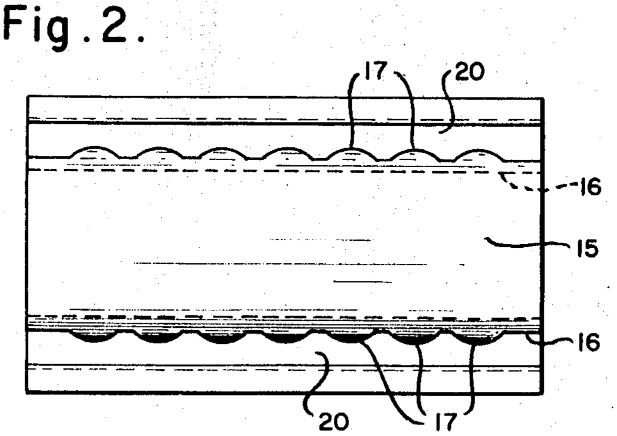
FIG. 2 is a bottom plan view of the shunt of FIG. 1.
Figure 3:
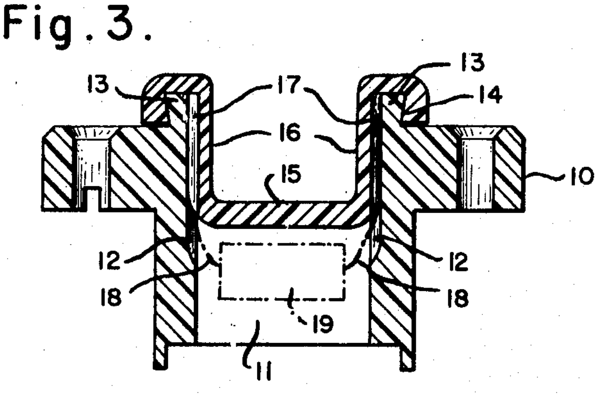
FIG. 3 is a section through a carrier and shunt with an integrated circuit in place.

Referring to the drawings I have illustrated a carrier 10 for a dual-in-line integrated circuit having 14 leads. The carrier 10 is provided with a well 11 having grooves or valleys 12 in its sidewalls and a ridge or flange 13 extending around the top of the well. The flange 13 is preferably under cut 14. A conductive shunt of generally U-shape is provided with a base 15 and sidewalls 16. The sidewalls 16 are provided with ridges 17 adapted to fit in the valleys 12 of the carrier to engage resiliently the leads 18 of integrated circuit 19. The top of the sidewalls 16 is provided with a channel 20 fitting over the ridge 13 on the carrier to lock the shunt in place on the carrier with the leads in conductive contact with the shunt. The shunt may be made of any conductive plastic such as conductive polyethylene.

I have shown the shunt and carrier for a dual-in-line integrated circuit, however, a similar structure can be used for flat pak integrated circuits. In the case of a circular configuration of integrated circuit the carrier may have a cylindrical well with splined walls and the shunt in the form of an interfitting cylindrical splined member with the leads held in the interfitting spline grooves and ridges.

While I have illustrated and described certain preferred embodiments of my invention in the foregoing specification it will be understood that this invention may be otherwise embodied.

I claim:

1. A carrier and conductive shunt structure for integrated circuits having leads comprising a nonconductive carrier having a well adapted to receive an integrated circuit, grooves in the sidewall of the well corresponding to and receiving the leads of the integrated circuit, a flange surrounding the well opening, a shunt of conductive plastic disposed in said well and having a base generally in the shape of the integrated circuit and upstanding sidewalls having ridges corresponding to the grooves in the well of the carrier and resiliently fitting therein and bearing on the leads of the integrated circuit therein and channel means at the top of the shunt sidewalls engaging the flange of the carrier in locking engagement.

2. A carrier and conductive shunt as claimed in claim 1 wherein the flange is undercut and the channel is provided with a lead engaging said undercut to lock the shunt in place.

3. A carrier and conductive shunt as claimed in claim 1 wherein the shunt is formed of conductive polyethylene.

4. A carrier and conductive shunt as claimed in claim 1 wherein the carrier has a rectangular well with grooves in two opposite sidewalls and the shunt is a U-shaped channel member fitting within said well.

5. A carrier and conductive shunt as claimed in claim 4 wherein the carrier is provided with flanges along the top of each of said two opposite sidewalls and the shunt is provided with channels at the top of each leg of said U-shaped channel member engaging said flanges.

* * * * *